United States Patent
Wellhöfer

(10) Patent No.: US 7,079,391 B2
(45) Date of Patent: Jul. 18, 2006

(54) COOLING DEVICE FOR AN ELECTRICAL OR ELECTRONIC UNIT

(75) Inventor: Stefan Wellhöfer, Schlossvippach (DE)

(73) Assignee: Innowert GmbH, Soemmerda (DE)

( * ) Notice: Subject to any disclaimer, the term of this patent is extended or adjusted under 35 U.S.C. 154(b) by 321 days.

(21) Appl. No.: 10/740,285

(22) Filed: Dec. 18, 2003

(65) Prior Publication Data

US 2004/0130871 A1    Jul. 8, 2004

(30) Foreign Application Priority Data

Dec. 20, 2002  (EP)  .................................. 02028617

(51) Int. Cl.
*H05K 7/20* (2006.01)

(52) U.S. Cl. ................. 361/694; 361/699; 165/104.21; 165/104.33

(58) Field of Classification Search ................ 361/689, 361/693, 696, 698, 699, 700, 704; 165/81, 165/82, 46, 185, 104.21, 104.26, 104.27, 165/104.33, 104.32; 174/15.2; 257/714, 257/715

See application file for complete search history.

(56) References Cited

U.S. PATENT DOCUMENTS

| | | | | |
|---|---|---|---|---|
| 3,603,382 A | * | 9/1971 | Paine et al. ............ | 165/104.26 |
| 4,633,371 A | * | 12/1986 | Nagy et al. ................. | 361/699 |
| 6,315,033 B1 | * | 11/2001 | Li ......................... | 165/104.33 |
| 6,450,132 B1 | * | 9/2002 | Yao et al. .................... | 122/366 |
| 6,725,909 B1 | * | 4/2004 | Luo ...................... | 165/104.21 |
| 6,907,918 B1 | * | 6/2005 | Connors et al. ....... | 165/104.26 |

* cited by examiner

*Primary Examiner*—Michael V. Datskovskiy
(74) *Attorney, Agent, or Firm*—Quarles & Brady LLP

(57) ABSTRACT

The invention refers to a cooling device for an electrical/electronic unit, comprising a heat-conductive base body, which has an envelope surface and which is suitable for being contacted with the unit to be cooled, further comprising a cooling profile body which is arranged at a spacing to the base body and which encompasses at least part of the envelope surface of the base body, wherein a locked, partially evacuated space is arranged between the base body and the cooling profile body, and further comprising a fleece soaked by a liquid and attached to the envelope surface of the base body.

10 Claims, 4 Drawing Sheets

COOLING DEVICE FOR AN ELECTRICAL OR ELECTRONIC UNIT

FIELD OF THE INVENTION

The present invention refers to a cooling device for electrical and/or electronic units, most of all for those generating a large amount of heat.

STATE OF THE ART

Cooling devices for electrical or electronic apparatus are required more than ever in modern high-tech apparatuses. Particularly the developments in the computer industry have been creating processors that have become more and more effective, which require considerable cooling due to the enormous amount of heat they generate. Cooling is mostly implemented by active fans generating undesired noise, and the failure of a fan quickly leads to overheating of the unit to be cooled and thus to its destruction. Moreover, the sensitive electrical/electronic units in these cooling systems are exposed to outer influences such as dust, moisture etc. due to the air inlet openings required in the housing.

To avoid these disadvantages, it was suggested to dissipate the heat generated by the electrical/electronic units directly via heat conduction by means of metal cooling bodies, which are connected with a cooling profile body on the outer wall of the housing. In this case, the disadvantage is that the heat is transferred badly over large distances and a safe discharge of heat cannot be ensured particularly in the case of high power loss of the components so that the risk of overheating also exists in this case.

Furthermore, the use of heat pipes for dissipating the heat generated by the electrical/electronic apparatus to a cooling profile body at the outer wall of the housing was suggested in DE 199 44 550 A1. The disadvantage is that particularly in the case of most recently developed processors generating enormous amounts of heat, the cooling is not sufficient to ensure a safe discharge of heat. Moreover, a multitude of single components heat pipe, cooling profile body are used, which are relatively expensive and which require a lot of space, since the configuration of the cooling system must be arranged newly depending on the type and position of the unit to be cooled. Finally, the cooling profile body is attached at the outer wall of the housing so that great additional effort must be made to obtain an aesthetic overall impression of the housing.

SUMMARY OF THE INVENTION

Thus, it is the object of the present invention to provide an integrated cooling device for an electrical and/or electronic unit by means of which a reliable cooling of components with a high heat generation can be carried out, which can flexibly be adapted to the respective shape of the object to be cooled and to the other geometric conditions, which can be manufactured at a low price, which can be supplied as a single component and which allows for an aesthetic design of the outer wall of the housing encompassing the electrical/electronic components.

According to the invention, a cooling device for an electrical and/or electronic unit is suggested, comprising a heat-conductive base body which has an envelope surface and which is suitable for being engaged with the unit to be cooled, having a cooling profile body arranged at a spacing to the base body and at least partially encompassing the envelope surface of the base body. A locked, partially-evacuated space is arranged between the base body and the cooling profile body, and the cooling device further comprises a fleece which is soaked with a liquid and which is attached on the envelope surface of the base body. The same inventive idea is provided by a cooling device having a heat-conductive base body formed as a hollow body, said base body having an inner wall surface and being suitable to be contacted with the unit to be cooled. The cooling device comprises a cooling profile body, which is arranged at a spacing to the base body and which is at least partially encompassed by the inner wall surface of the base body, wherein a locked, partially-evacuated space is located between the base body and the cooling profile body, and having a fleece which is soaked with a liquid and which is attached on the inner wall surface of the base body.

By such a cooling device according to the invention it is possible to safely dissipate even enormous heat quantities when cooling modern electrical/electronic units, such as processors, wherein at the same time the cost factor can be kept very low and the outer walls of the housing encompassing the electrical/electronic units are free from elements of the cooling device. The system can also be designed flexibly and does not require any maintenance.

Advantageously, at least one air duct having an upper and a lower opening is arranged in the area of the cooling profile body, so that the heat dissipated by the cooling profile body to the ambient air can easily be transferred out of the housing encompassing the electrical/electronic components.

Advantageously, a tubular envelope element is set onto the cooling profile body or a tubular inner element is inserted into the cooling profile body, respectively, in a manner that between the cooling profile body and the tubular envelope element or inner element, respectively, several chimney-like air ducts are formed, which are restricted by the cooling profile body and the envelope element or inner element. Thereby, the discharge of the heat dissipated by the cooling profile body to the ambient air is enormously improved, since the hot air rises upwards in the air ducts and at the same time cool air flows in from the bottom so that a draft is produced.

In order to further increase the heat dissipation, the cooling profile body can preferably be formed essentially as a tube, wherein its wall has a zigzag-formed or wavelike cross section.

The cooling device according to the invention preferably has mold members made of plastics between the cooling profile body and the base body, which lock the partially evacuated space in a gas-tight manner towards the top and the bottom. If in addition a non-conductive liquid is used for heat transmission, the cooling device according to the invention can also directly be connected with high-voltage components such as switching transistors, thyristors etc.

SHORT DESCRIPTION OF THE DRAWINGS

Further details, advantages and features of the present invention can be derived from the following description with reference to the enclosed drawings.

DETAILED DESCRIPTION OF THE INVENTION

Figure 1:
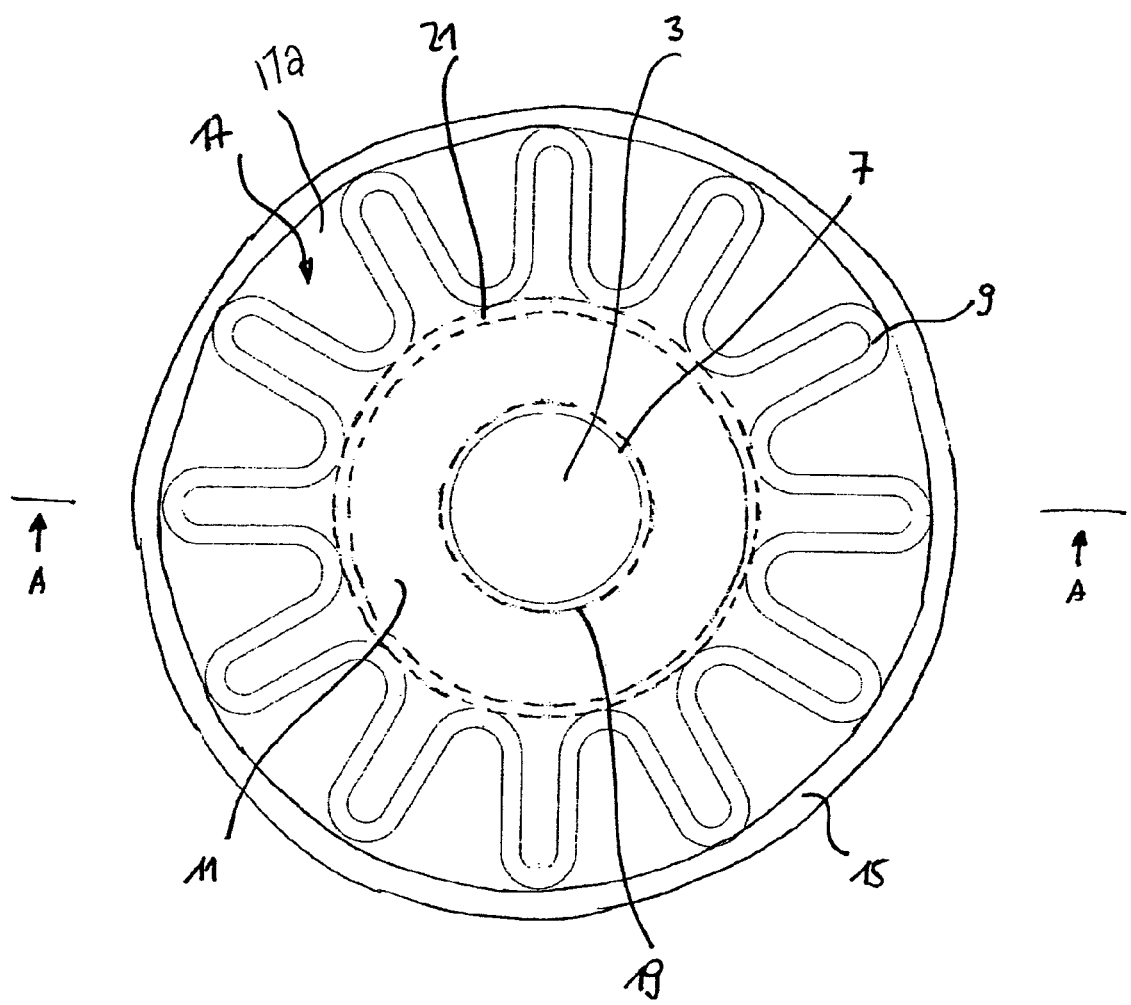
FIG. 1 shows a top plan view onto the first embodiment of the cooling device according to the invention.
Figure 2:
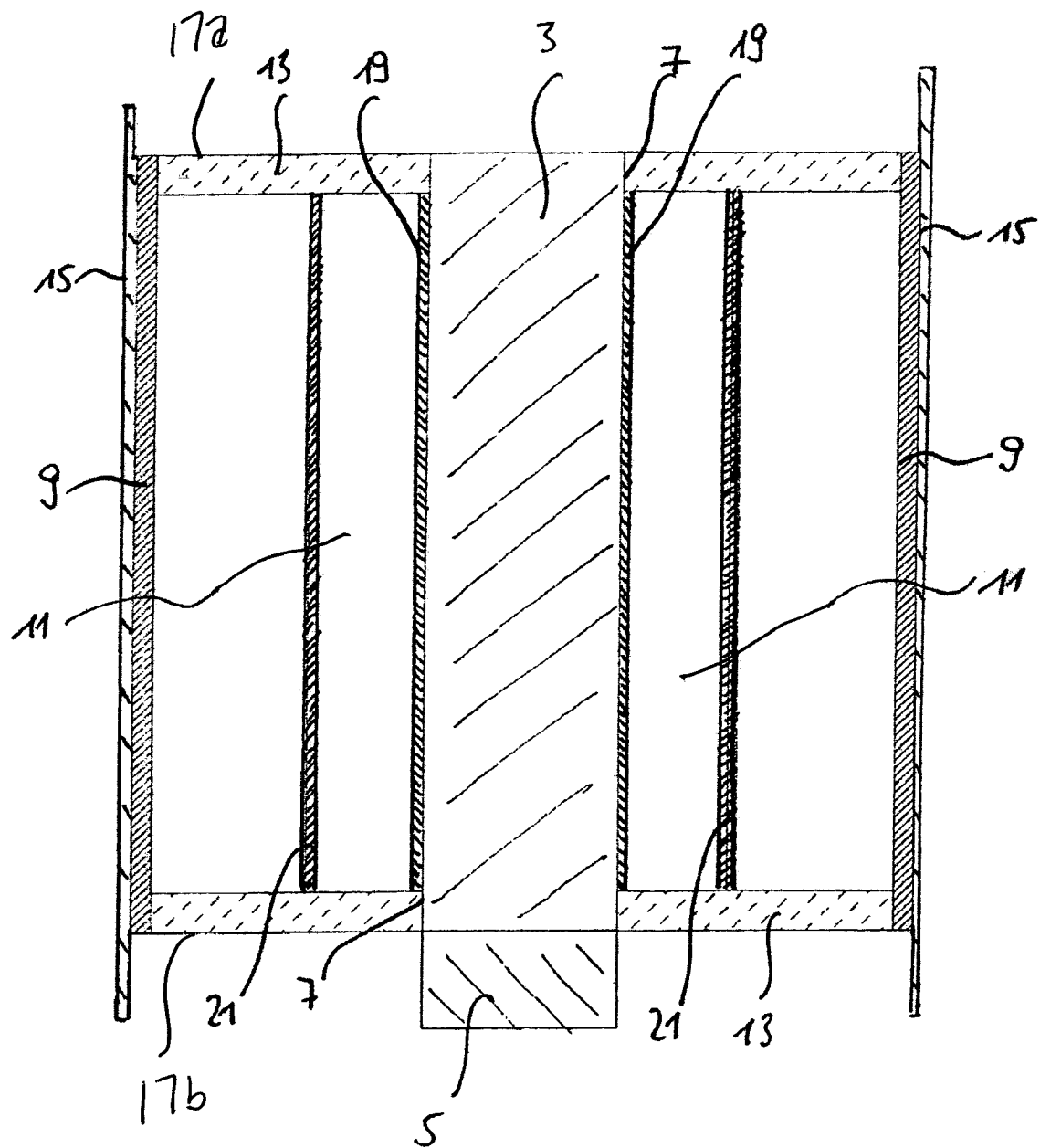
FIG. 2 shows a cross section according to A—A of the cooling device of FIG. 1.

FIG. 1 and FIG. 2 show a first preferred embodiment of the present invention. The cooling device has a base body 3, which is in contact with the electrical/electronic unit 5 to be cooled. This may either be implemented directly or via a further heat bridge not shown. In the embodiment shown, the base body 3 is formed as a full cylinder of a highly heat-conductive material, such as aluminum or copper, and should have base surface of at least the same size as the heat source 5 at the transition point. However, it is also possible to form the base body 3 as a full body with an oval or polygonal cross section or as a hollow body with almost any wall shape. In any case the base body 3 comprises an envelope surface 7 which encompasses the base body on its outer periphery.

A cooling profile body 9, which is also formed as a tube, is arranged at some spacing around the envelope surface 7 of the base body, wherein the wall of the cooling profile body is deformed for the purpose of surface enlargement. In the present example it is deformed by wavelike bulges. Star shapes, zigzag shapes and all other further profile shapes can also be used, which supply a sufficient surface for cooling. The cooling profile body 9 is in the ideal case designed such that it achieves a maximum surface and it consists of a material having favorable heat conduction properties, e.g. aluminum or copper.

A space 11 is arranged between the cooling profile body 9 and the base body 3, said space being partially evacuated to a certain degree by means of vacuum pumps that are known per se. In the upper and lower portion, this space 11 is locked in a gas-tight manner by means of mold members which are fixed between the base body 3 and the cooling profile body 9. These mold members 13 preferably consist of a hard plastic material and are connected to the cooling profile body 9 and the base body 3, e.g. by gas-tight adhesion, so that the partial vacuum is also maintained over a longer period of time. Additionally, further sealing measures known to the person skilled in the art can be taken. The mold member 13 may of course be made of any other suitable material, e.g. metal, but the use of hard plastics leads to the effect that the cooling device can also be used for cooling high-voltage components 5 without having to take further measures. The mold members must be worked very precisely and in the outer portion they have the same shape as the wall of the cooling profile body 9, and in the inner portion they have the shape of the base body 3. Thus, a kind of a flower with a circular central recess is produced in the present example. The partial vacuum is generated by a suitable valve and shall be as high as possible, since in the case of a stronger vacuum the boiling point of liquids is deeper. Preferably, the partial vacuum shall be upheld during the entire life of the electrical/electronic unit 5. However, it is also conceivable that the evacuation process is repeated in certain time intervals.

A tubular envelope element 15 is preferably set onto the cooling profile body 9, said envelope element encompassing the cooling profile body and tightly resting on the outer wall bulges of the cooling profile body. This tubular envelope element 15 may be made of almost any material. Preferably, it is formed as a flexible hose which is put over the cooling profile body 9. This leads to chimney-like air ducts 17 between two bulges of the cooling profile body 9 and the tubular envelope element 15, said air ducts having an upper and a lower opening, 17a and 17b, respectively, which are preferably located outside of the housing (not shown) that encompasses the electrical/electronic units 5. The tubular envelope element 15 can possibly also be left out if the cooling function is sufficient also without the chimney effect produced in the individual air ducts 17. The length of the chimney-like air ducts and their transfer means can be designed in almost any manner and basically depend on the geometry of the housing out of which the heat has to be transferred.

The cooling effect itself is supplied by a liquid, which is introduced into the partially-evacuated space 11 between the base body 3 and the cooling profile body 9. This liquid is first of all located in a fleece 19, which is attached at the envelope 7 of the base body 3 by means of adhesion. In the case of cooling of high-voltage components 5, a non-conductive liquid is used, preferably distilled water or alcohol. However, all other further liquids can be used that are suitable for heat transport.

Finally, a gauze 21 is arranged directly at the inner bulges of the cooling profile body 9 within the partially-evacuated space 11, said gauze serving for dissipation of condensed liquid. Particularly in the case of an inclined position of the cooling device, it serves for transporting the condensed liquid back into the lower portion of the cooling device and thus onto the fleece 19. In this case, a metal gauze may for instance be used. However, many other materials can also be used. Moreover, the face of the cooling profile body 9 facing the partially evacuated space 11 can also be covered by a fleece layer not shown, which is responsible for the discharge of condensed vapor due to its capillary effect.

Figure 3:
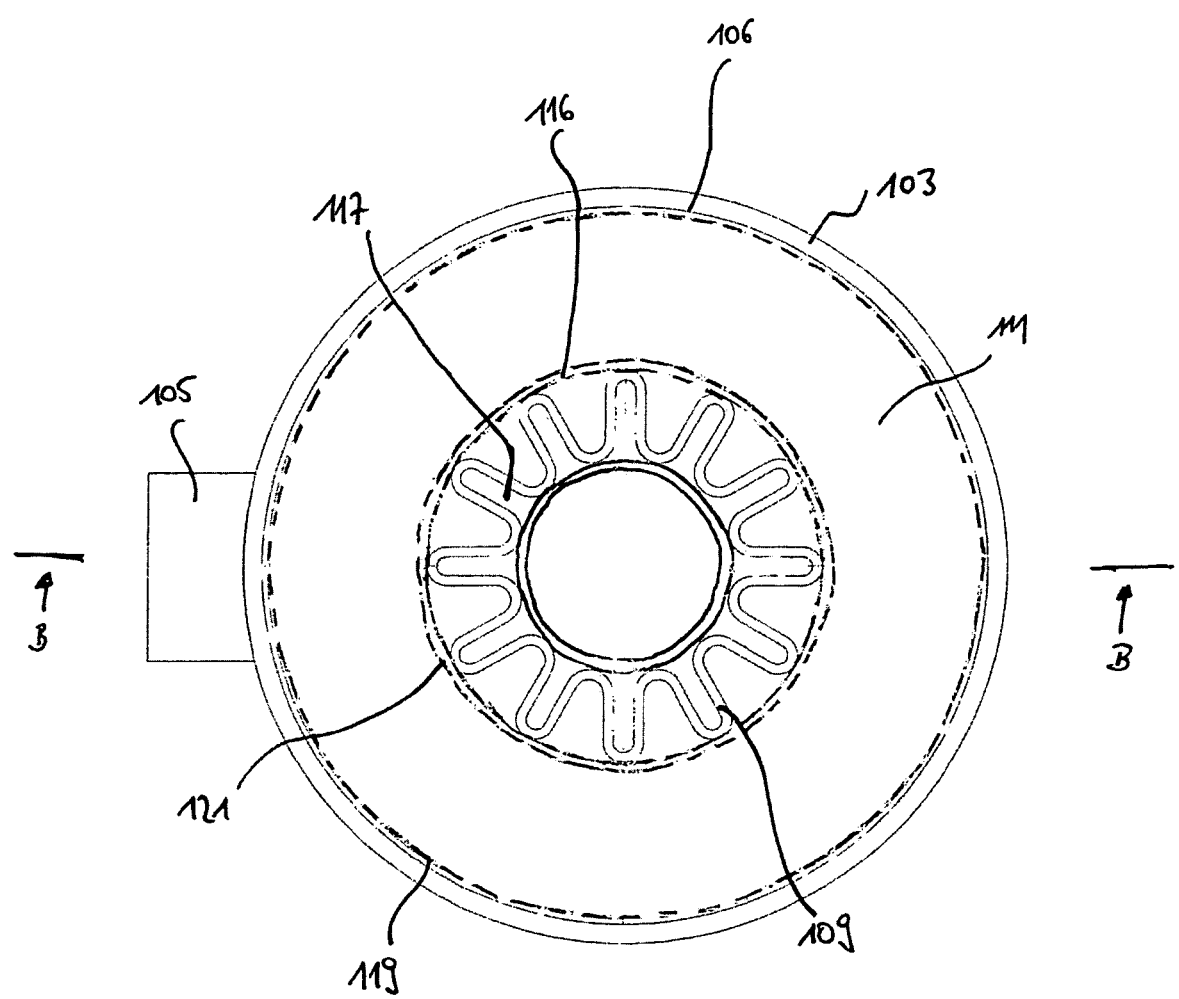
FIG. 3 shows a top plan view onto a second preferred embodiment of the cooling device according to the invention.
Figure 4:
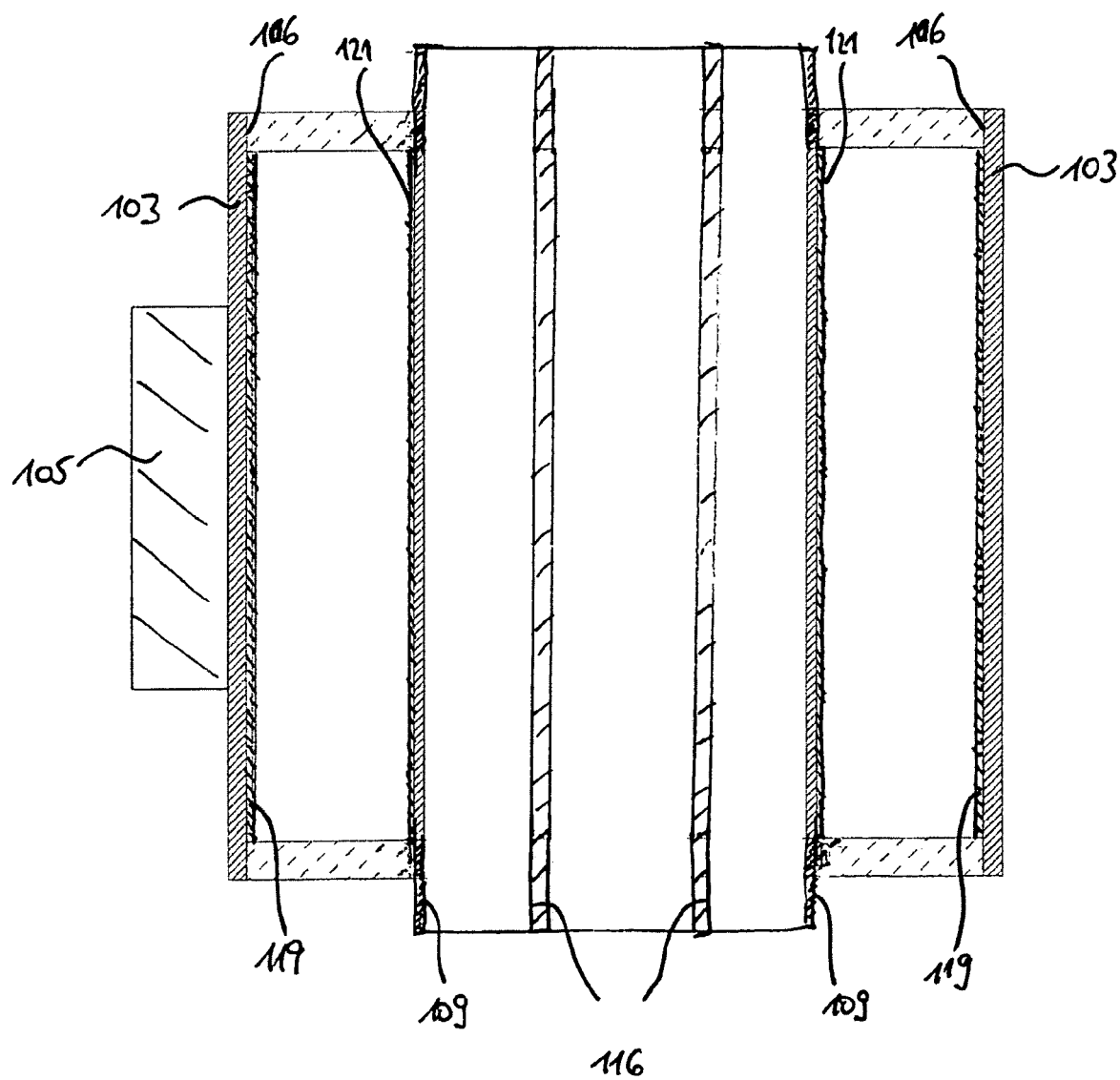
FIG. 4 shows a cross section according to B—B of the cooling device of FIG. 3.

FIGS. 3 and 4 show a second preferred embodiment of the cooling device according to the invention. Regarding the materials and the spatial design of the components, the comments made with respect to the embodiment described with reference to FIG. 1 and FIG. 2 apply, in case nothing else is explicitly mentioned. The embodiment described is based on the same invention idea. A base body 103 is again connected to an electrical/electronic unit 105. The base body 103 is formed as a hollow body, preferably as a hollow cylinder. The fleece 119 is attached to an inner wall face 106 of the base body 103. The cooling in the interior of the base body 103 in a manner that it is at least partially encompassed by the inner wall face 106 of the base body 103.

As in the first embodiment, a partially evacuated space is generated between the base body 103 and the cooling profile body 109, but the mold members 13 required for the gas-tight lock, which connect the base body 103 with the cooling profile body, are adapted at their outer edge to the shape of the base body 103 and at the inner edge to the shape of the cooling profile body 109.

A tubular inner element 116 is plugged into the cooling profile body 109 and tightly rests on its inwardly directed bulges so that chimney-like air ducts 117 are produced between two inner bulges of the cooling profile body 109 and the tubular inner element 116. The tubular inner element 116 consists of a material, which is sufficiently rigid to remain plugged in the interior of the cooling profile body 109. A gauze 121 tightly rests on the cooling profile body 109 within the partially evacuated space 111.

In the following, the cooling process according to the present invention will be explained. First of all, the heat-generating element 5 or 105, respectively, heats up and dissipates heat by convection to the base body 3 or 103, respectively. This causes the base body to heat up, and the liquid contained in the fleece 19 or 119 evaporates in the partially-evacuated space 11 or 111 already at relatively low temperatures, since due to the vacuum the boiling temperature drops. The liquid vapor diffuses through the gauze 21 or 121, respectively, and condenses at the wall of the cooling profile body 9 or 109 associated to the partially evacuated space 11 or 111, respectively, wherein heat is dissipated to this cooling profile body. The cooled, condensed liquid flows downwards at the cooling profile body 9 or 109 and is supplied again to the fleece 19 or 119. This may either be implemented on the direct way or by using suitable capillary structures, such as a further fleece. The gauze 21 or 121, respectively, prevents that in the case of an inclined position, drops of the condensed liquid fall directly back into the partially evacuated space 11 or 111. This heat transmission mechanism via evaporated liquid is extremely effective and provides a great heat transmission without high temperatures prevailing in the system itself.

The cooling profile body heats up by the heat dissipated by condensation of vapor and dissipates its heat to the ambient air. This air heats up and rises upwards in the chimney-like air ducts 17 or 117, respectively, while cool air flows from the bottom into the air ducts so that a strong suction effect is produced.

Finally, it is also conceivable to use several cooling devices in an array to further increase the heat dissipation.

An even better cooling effect is achieved when the fleece is directly attached onto the body to be cooled without using a base body, since thereby the heat conduction between the body to be cooled and the base body as a limiting factor for the heat dissipation no longer applies. For this purpose the body to be cooled must have a suitable geometry.

Thus, a cooling device is created, which can also be used in air, dust and water-tight systems, which can safely dissipate power losses of more than 150 W and can be manufactured at a relatively low price. Of course, this principle of an integrated cooling device without a fan is not restricted to the exact embodiment as it is disclosed in the description. It is also possible to only cover parts of the base body with a fleece or to encompass the base body at least in parts by the cooling profile body or vice versa. It is also conceivable that the cooling device according to the invention can also be used for the recovery of lost heat of polluted gases and liquids or for recovering heat generated in biological processes. For this purpose, the second embodiment is particularly suitable, since it shows a base body with a large heat receiving surface. On the whole, the cooling device according to the invention can flexibly be adapted to all outer basic conditions. Thus, an integrated solution is created, which is extremely space-saving and maintenance-free and which operates in an environmentally compatible way.

The invention claimed is:

1. A cooling device for an electrical or electronic unit, comprising a heat-conductive base body having two front surfaces and one envelope surface and being suitable for being contacted with a front surface of the unit to be cooled, further comprising a cooling profile body arranged at a spacing to the base body, wherein a locked, partially-evacuated space is located between the envelope surface of the base body and the cooling profile body, and further comprising a fleece soaked with a liquid and being attached to the envelope surface of the base body so that during operation the liquid contained in the fleece evaporates in the space, condenses at the inner wall surface of the cooling profile body and is supplied to the fleece again, wherein the cooling profile body encompasses the envelope surface of the base body in the radial direction.

2. A cooling device for an electrical or electronic unit, comprising a heat-conductive base body formed as a hollow body, said base body having an inner wall surface and an outer wall surface and being suitable for being contacted with the unit to be cooled through the outer wall surface, comprising a cooling profile body arranged in the interior of the base body in a manner that it is at least partially encompassed by the inner wall surface of the base body, wherein a gas-tight, partially evacuated space is arranged between the base body and the cooling profile body, and further comprising a fleece, which is soaked with a liquid and which is attached to the inner wall surface of the base body so that during operation the liquid contained in the fleece evaporates in the space, condenses at the wall of the cooling profile body facing the space and is supplied to the fleece again.

3. A cooling device as claimed in claim 1, wherein at least one air duct is arranged in the area of the cooling profile body, said duct having an upper and a lower opening.

4. A cooling device claimed in claim 2, wherein a tubular envelope element is set onto the cooling profile body in a manner that a plurality of chimney-like air ducts restricted by the cooling profile body and the envelope element are formed between the cooling profile body and the tubular envelope element.

5. A cooling device as claimed in claim 2, wherein at least one air duct is arranged in the area of the cooling profile body, said air duct having an upper and a lower opening.

6. A cooling device claimed in claim 5, wherein a tubular envelope element is set onto the cooling profile body in a manner that a plurality of chimney-like air ducts restricted by the cooling profile body and the envelope element are formed between the cooling profile body and the tubular envelope element.

7. A cooling device as claimed in claim 2, wherein a tubular inner element is inserted into the cooling profile body in a manner that a plurality of chimney-like air ducts restricted by the cooling profile body and the tubular inner element are formed between the cooling profile body and the tubular inner element.

8. Cooling device as claimed in claim 5, wherein a tubular inner element is inserted into the cooling profile body in a manner that a plurality of chimney-like air ducts restricted by the cooling profile body and the tubular inner element are formed between the cooling profile body and the tubular inner element.

9. A cooling device as claimed in claim 1, wherein plastic mold members are arranged between the cooling profile body and the base body, which lock the partially evacuated space towards the top and the bottom in a gas-tight manner.

10. A cooling device as claimed in claim 2, wherein plastic mold members are arranged between the cooling profile body and the base body, which lock the partially evacuated space towards the top and the bottom in a gas-tight manner.

* * * * *

UNITED STATES PATENT AND TRADEMARK OFFICE
CERTIFICATE OF CORRECTION

PATENT NO. : 7,079,391 B2
APPLICATION NO. : 10/740285
DATED : July 18, 2006
INVENTOR(S) : Stefan Wellhöfer Page 1 of 1

It is certified that error appears in the above-identified patent and that said Letters Patent is hereby corrected as shown below:

Col. 4, Line 36, "invention" should be --inventive--.

Col. 4. Line 40, following "The cooling", insert --profile body 109 has a smaller outer diameter and is arranged--.

Signed and Sealed this

Twenty-eighth Day of November, 2006

JON W. DUDAS
*Director of the United States Patent and Trademark Office*